(12) United States Patent
Borges et al.

(10) Patent No.: US 9,117,623 B1
(45) Date of Patent: Aug. 25, 2015

(54) FILAMENT CLAMP ASSEMBLY

(71) Applicants: Carlos F. M. Borges, Roslyn, NY (US); Manuel A. Jerez, Roosevelt, NY (US)

(72) Inventors: Carlos F. M. Borges, Roslyn, NY (US); Manuel A. Jerez, Roosevelt, NY (US)

(73) Assignee: ION TECHNOLOGIES SOLUTIONS, LLC, Mineola, NY (US)

( * ) Notice: Subject to any disclaimer, the term of this patent is extended or adjusted under 35 U.S.C. 154(b) by 7 days.

(21) Appl. No.: 14/243,141

(22) Filed: Apr. 2, 2014

(51) Int. Cl.
*H01J 1/88* (2006.01)
*H01J 37/08* (2006.01)
*H01J 37/317* (2006.01)

(52) U.S. Cl.
CPC ............. *H01J 37/08* (2013.01); *H01J 37/3171* (2013.01); *H01J 2237/032* (2013.01)

(58) Field of Classification Search
CPC .. H01J 37/08; H01J 37/3171; H01J 2237/032
USPC .................................................. 313/271, 292
See application file for complete search history.

(56) References Cited

U.S. PATENT DOCUMENTS

2011/0156570 A1* 6/2011 Jerez .............................. 313/275

* cited by examiner

*Primary Examiner* — Vip Patel
(74) *Attorney, Agent, or Firm* — Francis C. Hand; Carella, Byrne, et al.

(57) ABSTRACT

The filament clamp assembly has a pair of clamps to hold the connecting leads of a filament. Each clamp employs a locking pin within a longitudinally disposed bore that is moved into clamping engagement with a filament lead by rotation of a locking nut that moves a stud with a camming surface into the clamp to lift the locking pin via the camming surface.

16 Claims, 3 Drawing Sheets

FILAMENT CLAMP ASSEMBLY

This invention relates to a filament clamp assembly. More particularly, this invention relates to a filament clamp assembly for an ion source in an ion implant system.

As is known, ion sources are typically constructed with an indirectly heated cathode assembly and a filament for heating the cathode. Examples of such ion sources are known from U.S. Pat. No. 7,586,101.

As is known in the art, filaments that are employed in an ion implanter have been made with a pair of legs that function as connecting leads and a loop that extends between the legs. In some cases, the two electrically isolated legs of the filament are captured by a first and second filament clamp. These clamps typically employ a cam operation or setscrew to open integral jaws on the clamps for accepting the filament leads. The leads are in turn held by the spring force developed by the clamping jaws. Due to the extreme temperatures reached by the filament during operation, the clamping jaws will relax over time and take a permanent set. The electrical connection to the filament is thereby compromised and the ion source is in need of repair or replacement, resulting in repeated and extended periods of downtime for the implanter.

U.S. Pat. No. 8,319,410 describes a filament clamp assembly which is self aligning to the cathode assembly of an ion source. EP 0 840 346 describes another type of filament clamp assembly.

It is an object of this invention to provide an improved filament clamp assembly for an ion source.

It is another object of this invention to reduce the complexity of the filament clamp assembly of an ion source.

It is another object of this invention to provide a filament clamp assembly that is retrofitable to various existing ion implanters.

Briefly, the invention provides a filament clamp assembly comprised of a pair of clamps that are disposed in parallel relation for receiving a filament having a pair of connecting leads and a loop extending between the connecting leads.

Each clamp is formed as a one piece body having a first bore at one end, a second bore transverse to and in communication with the first bore and a third bore transverse to and in communication with second bore at a location remote from the end of the body.

In addition, each clamp has a locking pin slidably mounted in the second bore and extending between the first bore and the third bore; and means adjustably mounted in the third bore for abutting and moving the locking pin towards the first bore.

The connecting leads of the filament are in the form of sleeves that are sized so that each sleeve may be slidably received in the first bore of the clamp with a portion of the sleeve projecting into the second bore.

After a connecting lead of the filament is received in the first bore of a clamp, the means for moving the locking pin is adjusted to effect movement of the locking pin into clamping engagement with the projecting portion of the sleeve.

The means for moving the locking pin includes a stud that is slidably mounted in the third bore in non-rotatable relation and that has a camming surface abutting one end of the locking pin and a threaded end. In addition, the means for moving the locking pin has a locking nut threaded onto the threaded end of the stud in abutment with the clamp whereby in response to threading of the locking nut on the threaded end of the stud and against the body of the clamp, the stud moves into the body to move the locking pin towards the end of the body and against the sleeve of a filament to clamp the sleeve in place.

These and other objects and advantages of the invention will become more apparent from the following description taken in conjunction with the accompanying drawings wherein.

Figure 2:
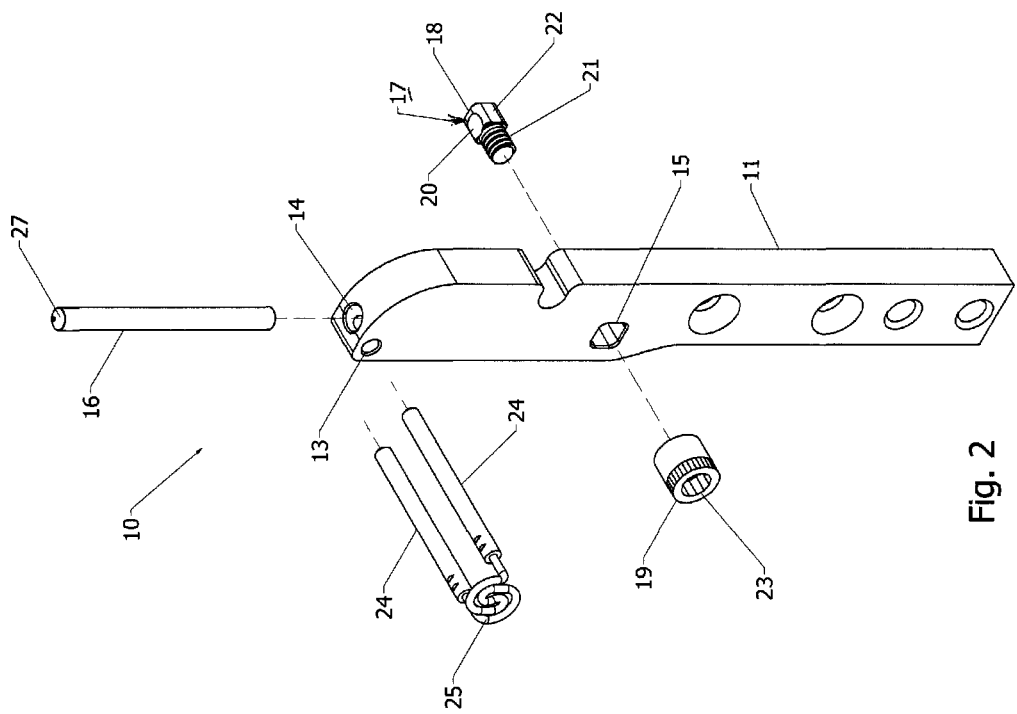
FIG. 2 is an exploded perspective view of the filament clamp and filament of FIG. 1.
Figure 1:
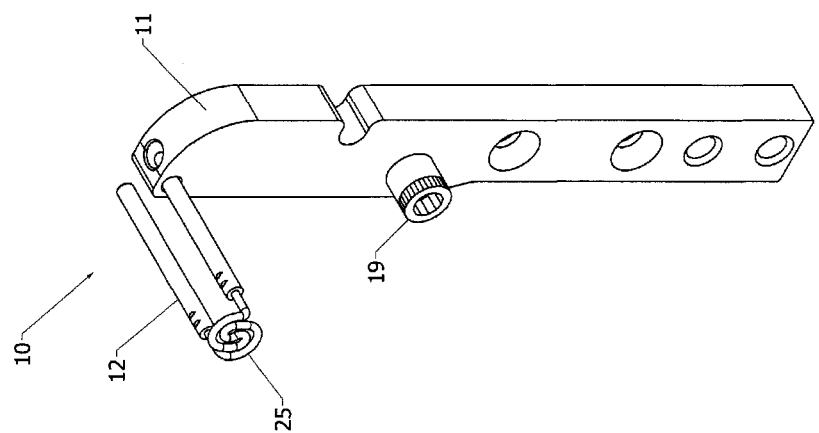
FIG. 1 is a perspective view of a filament clamp of a filament clamp assembly with a filament in place in accordance with the invention.

Referring to FIGS. 1 and 2, the filament clamp assembly 10 includes a pair of clamps 11 (only one of which is illustrated for purposes of simplicity) and a filament 12.

Figure 3:
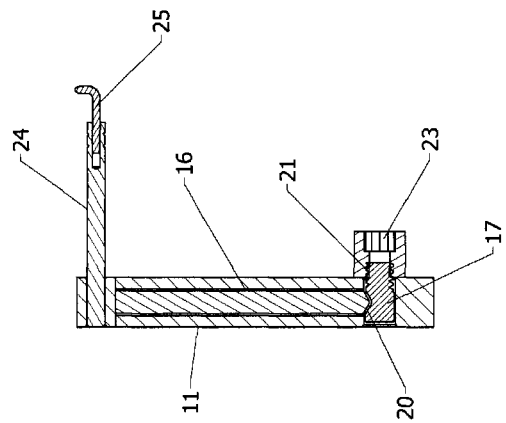
FIG. 3 is a partial cross-sectional view taken on line 3-3 of FIG. 4.
Figure 6:
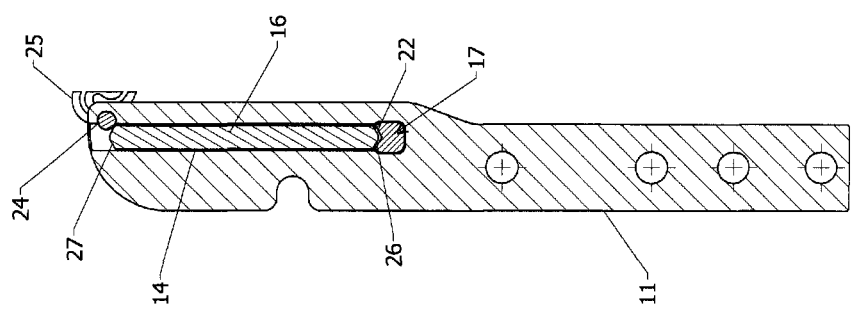
FIG. 6 is a cross-sectional view taken on line 6-6 of FIG. 5.
Figure 5:
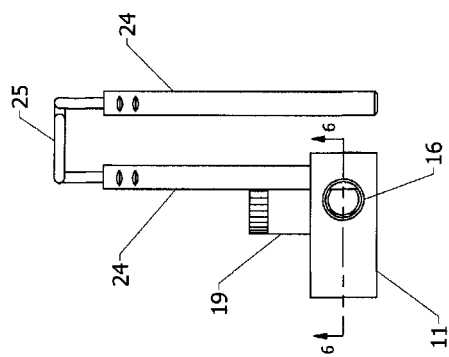
FIG. 5 is a top view of the filament clamp and filament of FIG. 1.

Referring to FIG. 2, each clamp 11 is formed as a one piece body having a first bore 13 at one end thereof transverse to the body, a second bore 14 transverse to and in communication with the first bore 13 and a third bore 15 transverse to and in communication with the second bore 14 at a location remote from the end of the body, as indicated in each of FIGS. 3 and 6. As shown in FIG. 6, the second bore 14 extends longitudinally of the clamp body.

Figure 4:
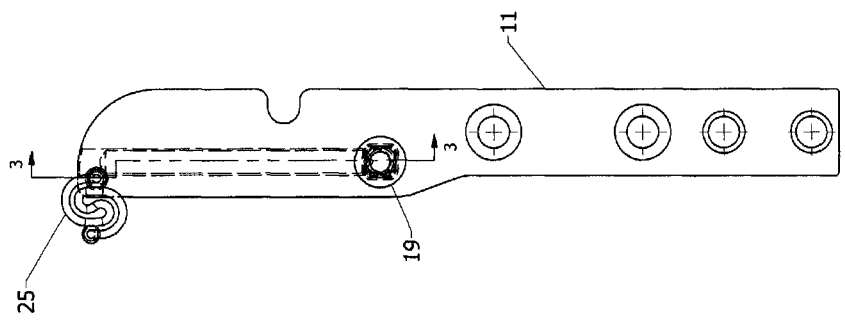
FIG. 4 is a side view of the filament clamp and filament of FIG. 1.

As shown in FIG. 1, the axis of the first bore 13 and the axis of the second bore 14 are offset from each other. That is, second bore 14 is on a longitudinal axis that is offset laterally from the axis of the first bore 13. In addition, the diameters of the bores 13, 14 are such that a portion (about a half) of the first bore 13 projects into the plane of the second bore 14 as illustrated in FIG. 4.

In addition, each clamp 11 includes a locking pin 16 that is slidably mounted in the second bore 14 and extends between the first bore 13 and the third bore 15 as well as a means 17 that is adjustably mounted in the third bore 15 for abutting and moving the locking pin 16 towards the first bore 13.

The means 17 for moving the locking pin 16 includes a stud 18 and a locking nut 19.

The stud 18 is slidably mounted in the third bore 15 in non-rotatable relation to the clamp body and has a camming surface 20 abutting one end of the locking pin 16 and a threaded end 21 that projects from the outer surface of the clamp body. As illustrated, the third bore 15 is of rectangular cross-section and the stud 18 has a head 22 of a mating rectangular cross-section to allow the stud 18 to slide within the bore 15.

The camming surface 20 of the stud 18 is located on the head 22 and is of wedge-like shape being sloped inwardly of the clamp body.

The locking nut 19 is threaded onto the projecting threaded end 21 of the stud 19 and is in abutment with the clamp body. The locking nut 19 has a hexagonal bore 23 for receiving a tool, such as an Allen wrench (not shown) so that in response to threading of the locking nut 19 on the threaded end 21 of the stud 18 and against the clamp body, the stud 18 moves into the clamp body to move the locking pin 16 towards the end of the clamp body.

That is, rotation of the locking nut 19 against the clamp body causes the locking nut 19 to pull the stud 18 into the clamp body. This, in turn, moves the camming surface 20 of the stud 18 under and across the bottom of the locking pin 16 (see FIG. 3).

Referring to FIG. 2, the filament 12 has a pair of connecting leads 24, each in the form of a cylindrical sleeve, and a loop 25 extending between the connecting leads 24. Each sleeve 24 is of a diameter to be slidably received in the first bore 13 of a clamp 11 while having a portion projecting into the second bore 14.

In this respect, the bore 13 extends completely through the clamp 11 such that the end of the sleeve 24 may be visually aligned with the surface of the clamp 11.

In order to mount the filament 12 in a clamp 11, the stud 17 is first inserted into the third bore 15 and the locking nut 19 threaded onto the stud 17 and against the clamp 11.

Next, the locking pin 16 is slid into the second bore 14 to rest against the camming surface 20 of the stud 17. As illustrated in FIG. 6, the locking pin 16 has a conically tapered end 26 that abuts the camming surface 20. Alternatively, the end of the locking pin 16 may be of a rounded hemi-spherical shape.

The camming surface 20 of the stud 17 and the bottom end 26 of the locking pin 16 are related such that when the locking pin 16 is first inserted in the longitudinal second bore 14 and rests on the camming surface 20, the top end 27 of the locking pin 16 is below the plane of the first bore 13, i.e. the locking pin 16 is in its lowest position relative to the bore 13. As the stud 17 is moved laterally into the clamp 11, the camming surface 20 causes the locking pin 16 to rise into the plane of the bore 13.

Thereafter, one of the sleeves 24 of the filament 12 is slid into the first bore 13 of the clamp 11 and seated with the end of the sleeve 24 flush with the outer surface of the clamp 11. In this position, as viewed in FIGS. 4 and 6, a portion of the sleeve 24 projects into the longitudinally disposed second bore 14 above the top end 27 of the locking pin 16.

Next, the locking nut 19 is rotated against the clamp body 11 causing the locking nut 19 to pull the stud 18 into the clamp body 11. This, in turn, moves the camming surface 20 of the stud 18 across the bottom of the locking pin 16 thereby lifting the locking pin 16 (see FIGS. 3 and 4) so that the top end 27 engages against the sleeve 24 (see FIG. 6) to clamp the filament 12 in place. As illustrated in FIG. 6, the locking pin 16 has a conically tapered top end 27 that abuts a side of the filament sleeve 24.

Of note, filament sleeves of different diameters may be accommodated in the first bore 13 so long as a portion of the sleeve projects into the longitudinally disposed second bore 14 and can be engaged by the locking pin 16 to be clamped in place.

As illustrated in FIG. 6, the locking pin 16 is of a length so that the top end 27 is recessed within the bore 14 of the clamp 11.

The invention thus provides a secure repeatable filament clamp assembly for holding the filament of an ion source. Replacement of a filament 12 may be readily performed by rotating a locking nut 19 against the clamp 11 to cause the stud 17 to move in a direction out of the bore 15 thereby allowing the locking pin 16 to dis-engage form a sleeve 24 of the filament under gravity to a sufficient extend to allow the filament 12 to be pulled from the clamp 11. With a fresh filament in place, the locking nut 19 can be again rotated to have the locking pin 16 engage the fresh filament. This procedure also reduces the downtime for servicing an ion implanter.

The invention also provides a filament clamp assembly which reduces the complexity of the filament clamp assembly and which is retrofitable to various existing ion implanters.

What is claimed is:

1. A clamp for a filament clamp assembly comprising
a one piece body having a first bore at one end thereof, a second bore transverse to and in communication with said first bore at said one end and a third bore transverse to and in communication with said second bore at a location remote from said one end;
a locking pin slidably mounted in said second bore and extending between said first bore and said third bore; and
means adjustably mounted in said third bore for abutting and moving said locking pin towards said first bore.

2. A clamp as set forth in claim 1 wherein said means includes a stud slidably mounted in said third bore in non-rotatable relation to said body and having a camming surface abutting one end of said locking pin and a threaded end and a locking nut threaded onto said threaded end of said stud in abutment with said body whereby in response to threading of said locking nut on said threaded end and against said body, said stud moves into said body to move said locking pin towards said one end.

3. A clamp as set forth in claim 2 wherein said third bore has a rectangular cross-section and said stud has a rectangular cross-section mated in said third bore.

4. A clamp as set forth in claim 2 wherein said locking nut has a hexagonal bore at an end opposite said stud.

5. A clamp as set forth in claim 1 wherein said second bore has a longitudinal axis offset laterally from an axis of said first bore.

6. A clamp as set forth in claim 5 wherein a portion of said first bore projects into the plane of said second bore.

7. A filament clamp assembly for an ion implanter comprising
a filament having at least one longitudinally extending sleeve; and
a clamp for mounting of said filament therein, said clamp having a first bore at one end thereof slidably receiving said sleeve, a second bore transverse to and in communication with said first bore, a third bore transverse to and in communication with said second bore at a location remote from said one end, a locking pin slidably mounted in said second bore and being in abutment with said sleeve at one end thereof and means adjustably mounted in said third bore for moving said locking pin towards said first bore to clamp said sleeve in said first bore.

8. A filament clamp assembly as set forth in claim 7 wherein said locking pin extends between said first bore and said third bore.

9. A filament clamp assembly as set forth in claim 7 wherein said locking pin has a tapered surface at one end abutting said sleeve.

10. A filament clamp assembly as set forth in claim 7 wherein said means includes a stud slidably mounted in said third bore in non-rotatable relation and having a camming surface abutting one end of said locking pin and a threaded end and a locking nut threaded onto said threaded end of said stud in abutment with said clamp whereby in response to threading of said locking nut on said threaded end and against said clamp, said stud moves into said third bore to move said locking pin towards said sleeve.

11. A filament clamp assembly as set forth in claim 10 wherein said third bore has a rectangular cross-section and said stud has a rectangular cross-section mated in said third bore.

12. A filament clamp assembly as set forth in claim 7 wherein said second bore has a longitudinal axis offset laterally from an axis of said first bore.

13. A filament clamp assembly as set forth in claim 12 wherein a portion of said first bore projects into the plane of said second bore.

14. A filament clamp assembly for an ion implanter comprising
- a pair of clamps disposed in parallel relation to mount a filament having a pair of parallel mounting sleeves therein,
- each said clamp having a one piece body having a first bore at one end thereof to receive a respective sleeve of the filament, a second bore transverse to and in communication with said first bore at said one end, a third bore transverse to and in communication with said second bore at a location remote from said one end; a locking pin slidably mounted in said second bore and extending between said first bore and said third bore; and means adjustably mounted in said third bore for moving said locking pin towards a respective sleeve in said first bore to clamp the respective sleeve therein.

15. A filament clamp assembly as set forth in claim 14 wherein said means includes a stud slidably mounted in said third bore in non-rotatable relation and having a camming surface abutting one end of said locking pin and a threaded end and a locking nut threaded onto said threaded end of said stud in abutment with said clamp whereby in response to threading of said locking nut on said threaded end and against said clamp, said stud moves into said third bore to move said locking pin towards said sleeve.

16. A filament clamp assembly as set forth in claim 14 further comprising a filament having a pair of sleeves defining connecting leads and a loop extending between said sleeves.

\* \* \* \* \*